United States Patent [19]
Miersch et al.

[11] 4,437,022
[45] Mar. 13, 1984

[54] MONOLITHICALLY INTEGRATED PUSH-PULL DRIVER

[75] Inventors: Eddehard F. Miersch, Boeblingen; Kurt Pollmann, Altdorf; Helmut Schettler, Dettenhausen; Rainer Zuhlke, Leonberg, all of Fed. Rep. of Germany

[73] Assignee: International Business Machines Corporation, Armonk, N.Y.

[21] Appl. No.: 336,203

[22] Filed: Dec. 31, 1981

[30] Foreign Application Priority Data

Jan. 30, 1981 [EP] European Pat. Off. ........ 81100662.6

[51] Int. Cl.³ .......................... A03K 3/26; A03K 5/00
[52] U.S. Cl. .................................. 307/270; 307/520; 307/542; 307/303; 307/317 A
[58] Field of Search ............... 307/443, 445, 446, 456, 307/459, 270, 520, 542, 563, 303; 270/255, 258

[56] References Cited

U.S. PATENT DOCUMENTS

| | | | |
|---|---|---|---|
| 3,473,047 | 10/1969 | Bohn et al. | 307/456 |
| 3,602,735 | 8/1971 | Lod | 307/456 |
| 4,037,115 | 7/1977 | Lee | 307/456 |
| 4,092,551 | 5/1978 | Howard et al. | 307/456 |
| 4,274,014 | 6/1981 | Schade, Jr. | 307/456 |
| 4,286,227 | 8/1981 | Sato | 330/255 |
| 4,306,159 | 12/1981 | Wiedmann | 307/456 |
| 4,330,723 | 5/1982 | Griffith | 307/443 |

OTHER PUBLICATIONS

Electro/80 Conference Record, May 13–15, 1980, Boston, MA, vol. 5, pp. 1–8, "Gate Array Experiences in IBM" by T. S. Jen & N. Nan.

*Primary Examiner*—Stanley D. Miller
*Assistant Examiner*—B. P. Davis
*Attorney, Agent, or Firm*—T. Rao Coca

[57] ABSTRACT

Push-pull driver with reduced noise generation resulting from driver switching. A further transistor is arranged between the driver output transistor (which becomes conductive at the low output level) and the chip ground line. Its base is connected to a reference voltage source the other pole of which is connected to the ground plane of the circuit card to which the corresponding semiconductor chip is attached. If a noise voltage is generated on the chip ground line, the emitter potential of the further transistor is pulled up. As its base potential is maintained at a fixed value by the applied reference potential, this transistor becomes less conductive. As a result, the rate of current change in the output stage is reduced. The slowed down current rise, leads to a reduced noise voltage developing on the common chip ground line. According to another embodiment of the invention the output transistor and said further transistor are combined to form one transistor whose base is maintained at a fixed voltage by means of two series-connected Schottky diodes.

6 Claims, 7 Drawing Figures

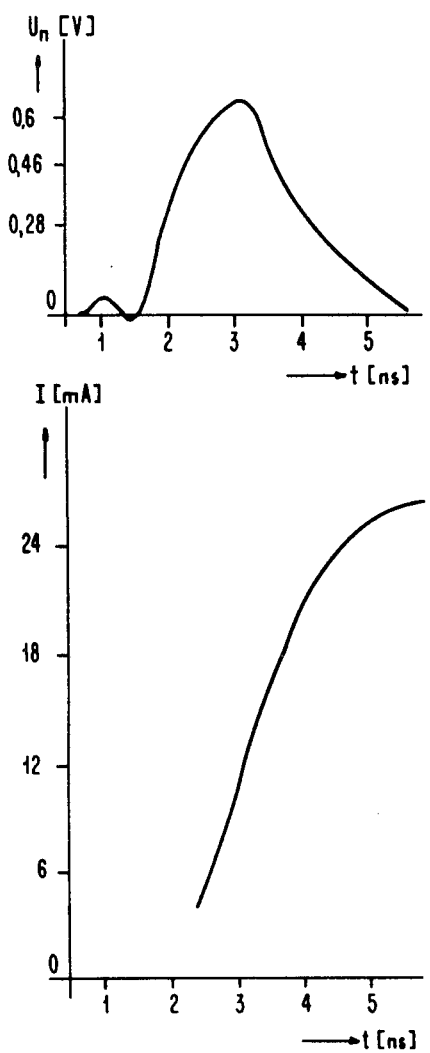
FIG. 4A
FIG. 4B
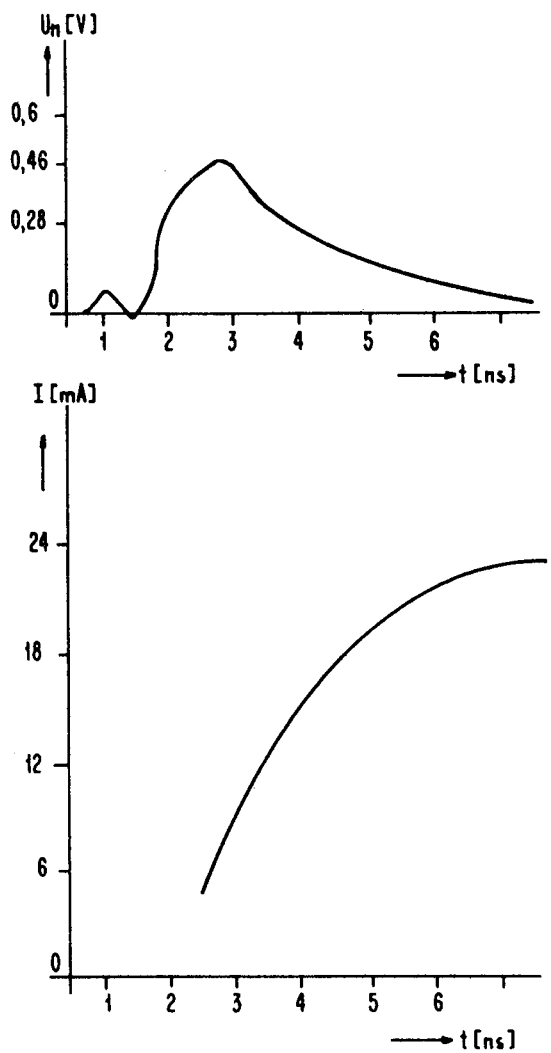
FIG. 5A
FIG. 5B

MONOLITHICALLY INTEGRATED PUSH-PULL DRIVER

BACKGROUND OF THE INVENTION

The invention relates to a monolithically integrated push-pull driver. More particularly, the invention refers to a push-pull driver circuit which minimizes the noise generated by the driver switching on a commonly shared voltage supply line, e.g., ground line.

As a result of the progress made in the production of monolithically integrated semiconductor circuits, the circuits necessary for a data processing system can be increasingly miniaturized on the semiconductor chip. This permits producing a greater number of circuits in the same area, e.g., on a semiconductor chip. The higher integration density, however, leads to an increased number of chip output lines and thus to a greater number of driver circuits required. In the interest of fast data processing, the data handling has to be executed in parallel. This means that more and more driver circuits have to be switched simultaneously. However, the inductance of the package or conductor, by means of which the semiconductor chip is connected to the ground (potential) plane of the respective circuit card carrying the semiconductor chip, causes an increasing problem of noise generation on the chip ground line. As this noise could potentially affect adjacent storage elements serving to store the results of logical operations performed, the noise voltage must be kept below the switching threshold of the storage elements to prevent their state from being undesirably changed. As the magnitude of the noise voltage is, amongst others, dependent upon the number of simultaneously switching driver stages, this number must be limited to confine the noise voltage to a given minimum value. For this purpose it has been necessary to subdivide the total number of driver stages necessary for the particular data transfer situation into several groups of driver stages switching simultaneously in the respective group and to control the switching of the several groups in a time staggered fashion. However, this time-staggered switching results in reduced data transfer speed.

Accordingly, it is an object of the invention to provide an improved driver circuit of the above-mentioned type.

More specifically, it is an object of the invention to provide a push-pull driver circuit which allows to minimize the noise generated by the driver switching action.

It is a further object of the invention to provide a new push-pull driver with a reduced noise generation on a shared voltage supply line which is suitably adapted for use in applications where several drivers are switched simultaneously.

SUMMARY OF THE INVENTION

To reduce the noise voltage on a chip ground line resulting from driver switching according to one embodiment of the invention, a further transistor is arranged between the driver output transistor which becomes conductive at the low output level, and the chip ground line. The base of the further transistor is connected to one pole of a d.c. reference voltage source the second pole of which is connected to the ground plane of the circuit card accommodating the semiconductor chip. The reference voltage source maintains the base potential of the further transistor. Its voltage is chosen so that after the output transistor has become conductive the further transistor becomes also fully conductive. If a noise voltage is generated on the chip ground line in response to the current rise occurring when the driver output transistor becomes conductive, the emitter potential of the further transistor is pulled up. As its base potential is maintained by the applied reference potential, this transistor becomes less conductive. As a result, the rate of current change in the output stage is reduced. The slowed down current rise, leads to a reduced noise voltage developing on the common chip ground line.

According to another embodiment of the invention the output transistor and said further transistor are combined to form one transistor whose base is connected to said reference potential.

The advantages achieved by the invention are mainly that since the noise is reduced it is no longer necessary to limit the number of simultaneously switching driver stages and thus to time-stagger the switching of several groups of driver stages switching simultaneously within the respective group. As a consequence the data transfer speed is improved.

BRIEF DESCRIPTION OF THE DRAWINGS

The foregoing and other objects, features and advantages of the invention will be described with reference to the drawings which illustrate preferred embodiments. In the drawings:

FIGS. 4A and 4B are time diagrams of the predicted noise voltage and the current causing the noise for the prior art circuit of FIG. 1, and FIGS. 5A and 5B illustrate time diagrams corresponding to those of FIGS. 4A and 4B for a driver circuit according to the embodiment of the present invention shown in FIG. 3.

DETAILED DESCRIPTION OF THE INVENTION

Figure 1:
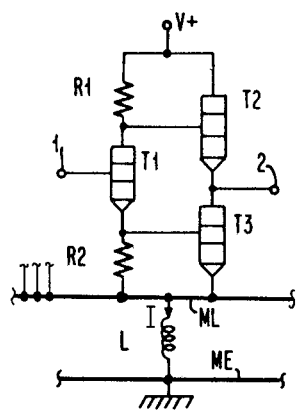
FIG. 1 is a circuit diagram of a prior art push-pull driver stage.

FIG. 1 shows a circuit diagram of the output stage of a conventional monolithically integrated push-pull driver circuit according to the prior art. L denotes the inductance of the connecting line by means of which the chip ground line ML is connected, via a conductive line on the chip substrate and a metallic connecting pin, to the ground plane ME of a circuit card accomodating the module made up of the particular semiconductor chip, its substrate and a cap. The operation of this known push-pull driver circuit is as follows:

If a low voltage level is applied to input terminal 1, transistor T1 is non-conductive. As a result, the base current flow from transistor T1 to transistor T3 ceases, so that the latter becomes non-conductive, too. Now, current flows into the base of transistor T2 via resistor R1. This transistor thus becomes conductive and a high potential is available at output 2 of the push-pull driver circuit.

If a high potential is applied to input terminal 1, transistor T1 becomes conductive, thus depriving transistor T2 of its base current and reducing it non-conductive. Instead, base current is applied through transistor T1 to transistor T3, so that the latter becomes conductive and transistor T2 non-conductive. The conductive transistor T3 leads to a low potential at the output 2 of the push-pull driver circuit. The current rise occurring in transistor T3 in response to its becoming conductive produces a noise voltage Un in inductance L at the chip ground line ML. The inductance L is essentially made up of a connector pin by means of which the ground line ML of chip and chip substrate is connected to the ground plane ME in the circuit card. This noise voltage increases with the current change per unit of time. If in the case of a plurality of push-pull driver circuits on the semi-conductor chip several, or in an extreme case all, transistors T3 are turned on simultaneously a correspondingly high switching current flows through inductance L common to all driver circuits, so that a correspondingly high noise voltage Un occurs at the ML ground line. The value of this noise voltage Un is computed in accordance with the relation:

$$Un = -L \frac{\Delta I}{\Delta t}. \quad (1)$$

Depending upon the number of transistors T3 becoming simultaneously conductive, the noise voltage can reach such a value that, for instance, storage elements close to the push-pull driver circuits are caused to change their stored state.

Figure 2:
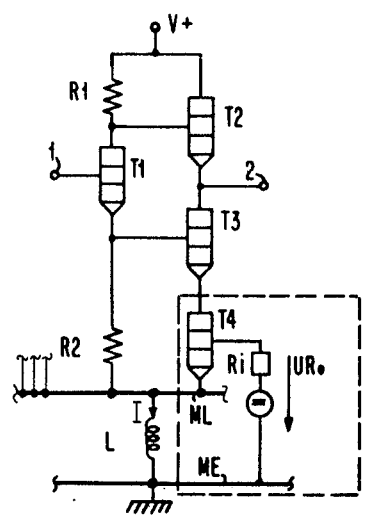
FIG. 2 is a circuit diagram of a push-pull driver circuit with a noise voltage limiting circuit according to a first embodiment of the invention.

FIG. 2 shows a circuit diagram of the output stage of an integrated push-pull driver circuit according to the invention, in which the noise voltage produced when switching on transistor(s) T3 is considerably reduced. This circuit differs from that according to FIG. 1 by a further transistor T4 which is inserted between the chip ground line ML and the emitter of transistor T3. The base of transistor T4 is—in case of NPN transistors—connected to the positive pole of a d.c. reference voltage source URo having an internal resistance Ri. The negative pole is connected to the ground line in an integration package level higher than the chip level, e.g., to the ground plane ME of the circuit card. The voltage URo of the reference d.c. operation voltage source is chosen so that transistor T4 is fully conductive in the d.c. operation mode.

The circuit of FIG. 2 operates as follows: Assume there is a positive noise voltage to ground, in response to a change in the current I flowing to ground plane ME. This occurs when several transistors T3 become simultaneously conductive. Then, the emitter potential of transistor T4 will rise accordingly, while its base potential is maintained at the potential determined by the reference source. As a result, the base-emitter voltage Ube of transistor T4 is reduced, so that this transistor becomes less conductive, i.e., its resistance increases, counteracting the rise in the current supplied by transistor T3. Thus the rise of this current is slowed down. Consequently, the magnitude of the noise voltage which is proportional to the rate of the current change supplied by transistor T3, is reduced. For the maximum acceptable noise voltage Unmax in relation to the reference voltage URo the following expression applies:

$$Unmax \leq URo - Ube_{(T4)} \quad (2)$$

For a satisfactory operation of the circuit the internal resistance Ri of the reference voltage source should be sufficiently high to limit the base current of transistor T4.

FIG. 4A shows a typical time diagram of the noise voltage Un developing at the chip ground line ML in a conventional push-pull driver circuit when transistor T3 becomes conductive. FIG. 4B shows the time diagram of the corresponding current I producing said noise voltage of FIG. 4A.

In comparison thereto, FIGS. 5A and 5B show the corresponding noise voltage and current time diagrams of a push-pull driver circuit according to the invention. A comparison of FIGS. 4A, 5A and 4B, 5B show that, as a result of the slowed down rise in the current of transistor T3, the noise voltage of the push-pull driver in accordance with the invention would be only about half as high as that occurring in the circuit of FIG. 1.

Figure 3:
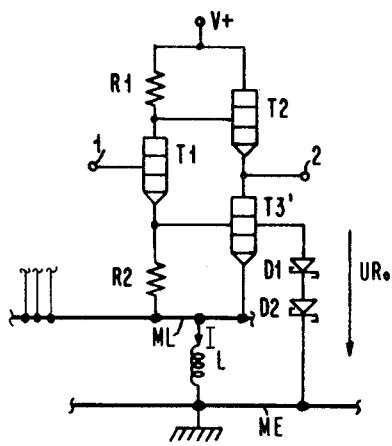
FIG. 3 is a circuit diagram of a simplified push-pull driver according to another embodiment of the invention.

FIG. 3 shows a simplified version of the above-described push-pull driver circuit. Here, transistors T3 and T4 of the circuit of FIG. 2 are combined to form transistor T3', whose base is also connected to the positive pole of the reference voltage URo. In this embodiment the d.c. reference voltage source is realized by two series-connected Schottky diodes D1 and D2. The operation of this push-pull driver circuit is the same as described in connection with FIG. 2.

For a given value of the maximum permissible noise voltage, the reduced noise voltage generation of the push-pull driver circuit in accordance with the invention permits a greater number of driver stages than previously possible to be simultaneously switched to the low output level. This also eliminates the need for time-staggered switching operation of the push-pull driver circuits grouped together and switched simultaneously within the respective group. As an overall result a significantly increased data transfer speed is achievable. To further reduce a potential influence of the push-pull driver circuits on adjacent storage elements providing a separate ground line ML serving the driver circuits as well as a separate connection of said line to the ground plane ME of the circuit card is an additional improvement.

While the invention has been particularly shown and described with reference to the preferred embodiments thereof, it will be understood by those skilled in the art that various changes in form and detail may be made therein without departing from the spirit and scope of the invention.

What is claimed is:

1. Integrated push-pull driver circuit having a reduced noise voltage including an output stage connected between a first and second chip voltage supply line and a third voltage supply line provided on an integration package level higher than the level of the chip comprising the driver circuit, said third voltage supply line carrying substantially the same potential as said second chip voltage line, said output stage comprising:
 a first transistor the collector-emitter path being connected between said first voltage supply line and an output terminal;
 a second transistor the collector-emitter path being connected in series with the collector-emitter path of the first transistor with the collector of the second transistor being connected to the output terminal;
 means for forming from an input signal corresponding true and inverted signals and applying them to the bases of said first and second transistors, respectively;

a third transistor the collector-emitter path being connected between the emitter of the second transistor and the second voltage supply line; and means connected between the base of the third transistor and said third voltage supply line establishing a reference potential at said base and reducing the rate of current change through the second transistor when said second transistor is turned on;

whereby a reduced noise voltage is generated on the second chip voltage supply line.

2. Integrated push-pull driver circuit having a reduced noise voltage including an output stage connected between a first and second chip voltage supply line and a third voltage supply line provided on an integration package of the chip comprising the push pull driver circuit, said third voltage supply line being at substantially the same potential as said second chip voltage supply line, said output stage comprising:

a first transistor the collector-emitter path being connected between said first voltage supply line and an output terminal;

a second transistor the collector-emitter path being connected in series with the collector-emitter path of the first transistor with the collector of the second transistor being connected to the output terminal and the emitter of the second transistor connected to the second voltage supply line; and means for forming from an input signal corresponding true and inverted signals and applying them to the bases of said first and second transistors, respectively;

control means connected between the base of the second transistor and the third voltage supply line establishing a reference potential at said base and reducing the rate of current change through the second transistor when said second transistor is turned-on;

whereby a reduced noise voltage is generated on said second voltage supply line.

3. The driver circuit as defined in claim 2 wherein said means for establishing a reference potential comprises Schottky diodes coupled in series between the base of the second transistor and the third voltage supply line.

4. The driver circuit as defined in claim 1 or 2 wherein the second and third voltage supply lines are ground lines.

5. The driver circuit as defined in claims 1, 3 or 2 wherein said reference potential is chosen to counteract a rise in the current flowing through the second transistor.

6. The driver circuit as defined in claims 1, 3, 4 or 2 wherein said second voltage supply line is a commonly shared ground line for a plurality of driver circuits integrated in that particular semiconductor chip.

* * * * *